(12) United States Patent
Miyanari et al.

(10) Patent No.: US 10,284,171 B2
(45) Date of Patent: *May 7, 2019

(54) ACOUSTIC WAVE DEVICES HAVING IMPROVED CONNECTION RELIABILITY

(71) Applicant: SKYWORKS FILTER SOLUTIONS JAPAN CO., LTD., Kadoma-Shi (JP)

(72) Inventors: Mitsunori Miyanari, Osaka-Fu (JP); Yosuke Hamaoka, Osaka-Fu (JP); Toru Yamaji, Kyoto-Fu (JP); Hidekazu Nakanishi, Osaka-Fu (JP); Hiroyuki Nakamura, Osaka-Fu (JP)

(73) Assignee: SKYWORKS FILTER SOLUTIONS JAPAN CO., LTD., Kadoma-Shi (JP)

(*) Notice: Subject to any disclaimer, the term of this patent is extended or adjusted under 35 U.S.C. 154(b) by 155 days.

This patent is subject to a terminal disclaimer.

(21) Appl. No.: 15/449,104

(22) Filed: Mar. 3, 2017

(65) Prior Publication Data
US 2017/0179921 A1   Jun. 22, 2017

Related U.S. Application Data

(63) Continuation of application No. 14/789,092, filed on Jul. 1, 2015, now Pat. No. 9,628,047, which is a (Continued)

(30) Foreign Application Priority Data

Jul. 7, 2014   (JP) ................ 2014-139343

(51) Int. Cl.
*H03H 9/02* (2006.01)
*H03H 9/25* (2006.01)
(Continued)

(52) U.S. Cl.
CPC ........ *H03H 9/02992* (2013.01); *H01L 41/29* (2013.01); *H03H 3/08* (2013.01);
(Continued)

(58) Field of Classification Search
CPC ........... H03H 9/02834; H03H 9/02897; H03H 9/02937; H03H 9/02984; H03H 9/02992;
(Continued)

(56) References Cited

U.S. PATENT DOCUMENTS 7,479,852 B2   1/2009   Takamine
7,486,159 B2   2/2009   Fujii et al.
(Continued)

FOREIGN PATENT DOCUMENTS

EP   1443643 A1   8/2004
JP   H1141054 A   2/1999
(Continued)

*Primary Examiner* — Barbara Summons
(74) *Attorney, Agent, or Firm* — Lando & Anastasi, LLP

(57) ABSTRACT

An elastic wave device including a substrate, an interdigital transducer (IDT) electrode provided on an upper surface of the substrate, a first wiring electrode provided on the upper surface of the substrate and connected to the IDT electrode, a dielectric film that does not cover a first region of the first wiring electrode but covers a second region of the first wiring electrode above the substrate, the first wiring electrode including a cutout in the second region, and a second wiring electrode that covers an upper surface of the first wiring electrode in the first region and an upper surface of the dielectric film in the second region above the substrate.

20 Claims, 6 Drawing Sheets

Related U.S. Application Data continuation of application No. PCT/JP2015/003223, filed on Jun. 26, 2015.

(51) Int. Cl.
  *H01L 41/29* (2013.01)
  *H03H 9/72* (2006.01)
  *H03H 3/08* (2006.01)

(52) U.S. Cl.
  CPC .... *H03H 9/02897* (2013.01); *H03H 9/02984* (2013.01); *H03H 9/25* (2013.01); *H03H 9/725* (2013.01); *H03H 9/02834* (2013.01); *H03H 9/02937* (2013.01)

(58) Field of Classification Search
  CPC ............ H03H 9/25; H03H 9/64; H03H 9/725; H03H 3/08; H01L 41/29; H01L 41/33
  USPC ........................ 333/133, 193–196; 310/313 B
  See application file for complete search history.

(56) References Cited

U.S. PATENT DOCUMENTS

| | | | |
|---|---|---|---|
| 8,427,258 | B2 | 4/2013 | Tanaka et al. |
| 9,628,047 | B2* | 4/2017 | Miyanari ............ H03H 9/02992 |
| 2004/0174090 | A1 | 9/2004 | Koshido |
| 2009/0236934 | A1 | 9/2009 | Aikawa et al. |
| 2012/0279795 | A1* | 11/2012 | Furukawa ........... H03H 9/02992 |
| | | | 181/139 |
| 2013/0088305 | A1 | 4/2013 | Takata |
| 2015/0155853 | A1* | 6/2015 | Toyota ............... H03H 9/02897 |
| | | | 333/193 |

FOREIGN PATENT DOCUMENTS

| | | |
|---|---|---|
| JP | 2005210475 A | 8/2005 |
| JP | 2007142491 A | 6/2007 |
| JP | 2009182407 A | 8/2009 |
| JP | 2012004613 A | 1/2012 |

\* cited by examiner

ACOUSTIC WAVE DEVICES HAVING IMPROVED CONNECTION RELIABILITY

CROSS REFERENCE TO RELATED APPLICATIONS

This application is a continuation of and claims priority under 35 U.S.C. § 120 to co-pending U.S. application Ser. No. 14,789,092 filed on Jul. 1, 2015 and titled "ACOUSTIC WAVE DEVICES, AND ANTENNA DUPLEXERS, MODULES AND COMMUNICATION DEVICES USING SAME, which claims priority under 35 U.S.C. § 119 and PCT Article 8 to co-pending Japanese Patent Application No. 2014-139343 filed on Jul. 7, 2014 and titled "ELASTIC WAVE DEVICES, AND ANTENNA DUPLEXERS, MODULES AND COMMUNICATION DEVICES USING SAME," and which further claims priority under 35 U.S.C. § 120 to co-pending International Application No. PCT/JP2015/003223 filed on Jun. 26, 2015 and titled "ACOUSTIC WAVE DEVICES, AND ANTENNA DUPLEXERS, MODULES, AND COMMUNICATION DEVICES USING SAME," each of which is herein incorporated by reference in its entirety for all purposes.

BACKGROUND

Field of Invention

Aspects and embodiments relate to an elastic wave device used in a mobile communication device and the like, and an antenna duplexer, a module and a communication device using the same.

Description of Related Art

Certain examples of a conventional elastic wave device include an interdigital transducer (IDT) electrode provided on a piezoelectric substrate, a first wiring electrode connected to the IDT electrode, a dielectric film that covers the IDT electrode and the first wiring electrode but does not cover a portion of the first wiring electrode, and a second wiring electrode provided from an upper surface of the first wiring electrode toward an upper surface of the dielectric film and crossed with the first wiring electrode at a different height above the surface of the piezoelectric substrate, referred to herein as being crossed at a different grade. Such an elastic wave device is disclosed in Japanese Patent Application Publication No. 2009-182407, for example.

SUMMARY OF INVENTION

The above-discussed conventional elastic wave device suffers from connection reliability problems, such as an increase in the resistance value of the wiring electrode, an increase in the probability of the wiring electrode becoming disconnected, and other problems caused by thinning of the second wiring electrode at the transition region where the second wiring electrode transitions from the upper surface of the first wiring electrode to the upper surface of the dielectric film. Further, a protrusion may sometimes occur at an edge of the dielectric film due to the manufacturing process, and as a result, the coatability of the wiring electrode may be deteriorated, and the wiring electrode may experience a stress at the edge, which can cause an increased disconnection probability at the edge of the dielectric film.

To address these problems, aspects and embodiments of the present invention provide an elastic wave device having an improved connection reliability for the wirings crossed with each other at a different grade (different heights above the substrate).

According to certain embodiments, an elastic wave device includes a substrate, an interdigital transducer (IDT) electrode provided on an upper surface of the substrate, a first wiring electrode provided on the upper surface of the substrate and connected to the IDT electrode, a dielectric film that does not cover a first region of the first wiring electrode but covers a second region of the first wiring electrode on the substrate, the first wiring electrode including a cutout in the second region adjacent to the first region, and a second wiring electrode provided from an upper surface of the first region of the first wiring electrode toward an upper surface of the dielectric film.

According to the aforementioned configuration, the elastic wave device may have improved connection reliability for the wirings crossed with each other at a different grade.

Various embodiments of the elastic wave filter may include any one or more of the following features.

According to one embodiment, an elastic wave device comprises a substrate, an interdigital transducer (IDT) electrode provided on an upper surface of the substrate, a first wiring electrode provided on the upper surface of the substrate and connected to the IDT electrode, the first wiring electrode having first and second regions, a dielectric film disposed over the upper surface of the substrate, and disposed over and covering the first wiring electrode in the second region, the dielectric film being disposed such that it does not extend over and cover the first wiring electrode in the first region, the first wiring electrode including a cutout in the second region, and a second wiring electrode disposed over and covering an upper surface of the first wiring electrode in the first region, and disposed over and covering an upper surface of the dielectric film in the second region above the substrate.

In one example a thickness of a first portion of the dielectric film disposed over the first wiring electrode in the second region is less than a thickness of a second portion of the dielectric film covering an upper surface of the substrate. The thickness of the first portion of the dielectric film further may be less than a thickness of the second wiring electrode. In one example a thickness of thinnest portions of the second wiring electrode extending from an edge of the dielectric film to an upper surface of the second wiring electrode around a location where the first region and the second region are proximate to each other is less than a thickness of the second wiring electrode in the second region. In another example a thickness of the IDT electrode is in a range from 0.2 μm to 0.6 μm. In another example a thickness of the first wiring electrode is in a range from 0.2 μm to 0.6 μm. In another example a thickness of the second wiring electrode is in a range from 1.0 μm to 3.0 μm.

In one example the substrate includes a single crystal piezoelectric material.

In one example the cutout includes a pattern of comb teeth that is provided from an edge of the first wiring electrode extending toward the first region. In another example the cutout is slit shaped. In another example the cutout includes a through-hole provided across the first wiring electrode and extending from an upper surface of the first wiring electrode to the upper surface of the substrate. In another example the cutout includes a recess provided within the first wiring electrode.

Additional aspects and embodiments are directed to providing an elastic wave filter and an antenna duplexer using such an elastic wave device, as well as a module and a communication device using the same.

According to another embodiment, a method of manufacture of an elastic wave device comprises steps of forming an interdigital transducer (IDT) electrode on an upper surface of a substrate, forming a first wiring electrode on the upper surface of the substrate and connecting the first wiring electrode to the IDT electrode, and forming a cutout in a portion of the first wiring electrode. The method further includes steps of forming a dielectric film over the upper surface of the substrate, the dielectric film being formed and disposed so as to cover the first wiring electrode in the second region and so as not to extend over and cover the first wiring electrode in the first region, the cutout in the portion of the first wiring electrode being located in the second region, and forming a second wiring electrode above the substrate, including disposing the second wiring over and covering an upper surface of the first wiring electrode in the first region, and disposing the second wiring over and covering at least a portion of an upper surface of the dielectric film in the second region.

In one example the step of forming the dielectric film includes forming the dielectric film with a first thickness over the substrate in a region where the first wiring electrode is not present, and forming the dielectric film with a second thickness over the first wiring electrode in the second region, the second thickness being less than the first thickness.

In one example the step of forming the cutout includes forming a plurality of through-holes in the portion of the first wiring electrode, the plurality of through-holes extending from the upper surface of the first wiring electrode to the upper surface of the substrate. In another example the step of forming the cutout includes forming at least one slit in the portion of the first wiring electrode. In another example the step of forming the cutout includes forming a pattern of comb teeth in the portion of the first wiring electrode, the pattern of comb teeth extending from an edge of the first wiring electrode toward the first region. In another example the step of forming the cutout includes forming a recess in the portion of the first wiring electrode.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

As discussed above, aspects and embodiments are directed to an elastic wave device including two or more wirings that cross one another at a different grade (different heights above the surface of the substrate) and are separated and electrically insulated from one another by a dielectric film, the elastic wave device having a structure that prevents excessive thinning of the upper wiring at the edges of the dielectric film. Embodiments of the elastic wave device have improved connection reliability for such crossed wirings, and therefore may have improved reliability and/or performance. Similarly, components incorporating such elastic wave devices, such as antenna duplexers, modules, and communication devices, for example, may also have improved characteristics.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and the like are intended for convenience of description, not to limit the present systems and methods or their components to any one positional or spatial orientation. In particular, as described below terms indicating directions such as "above," "below," "upper surface," "lower surface" and the like are used for designating relative directions depending only on a relative positional relationship between components included in embodiments of the elastic wave device, such as a substrate, an IDT electrode and the like, and therefore are not intended to designate absolute directions such as a vertical direction for example.

Figure 1A:
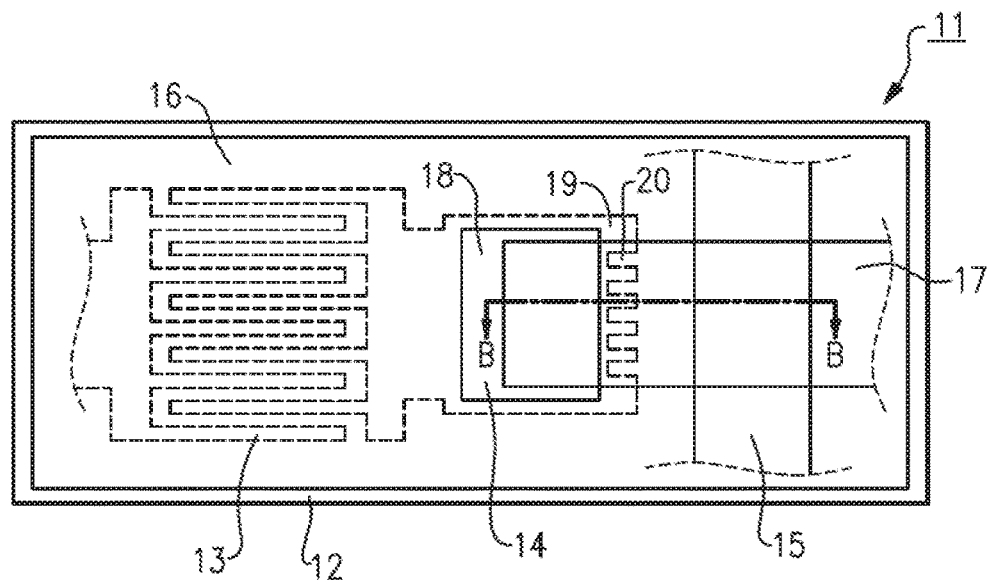
FIG. 1A is a top view of one embodiment of an elastic wave device according to aspects of the present invention.
Figure 1B:
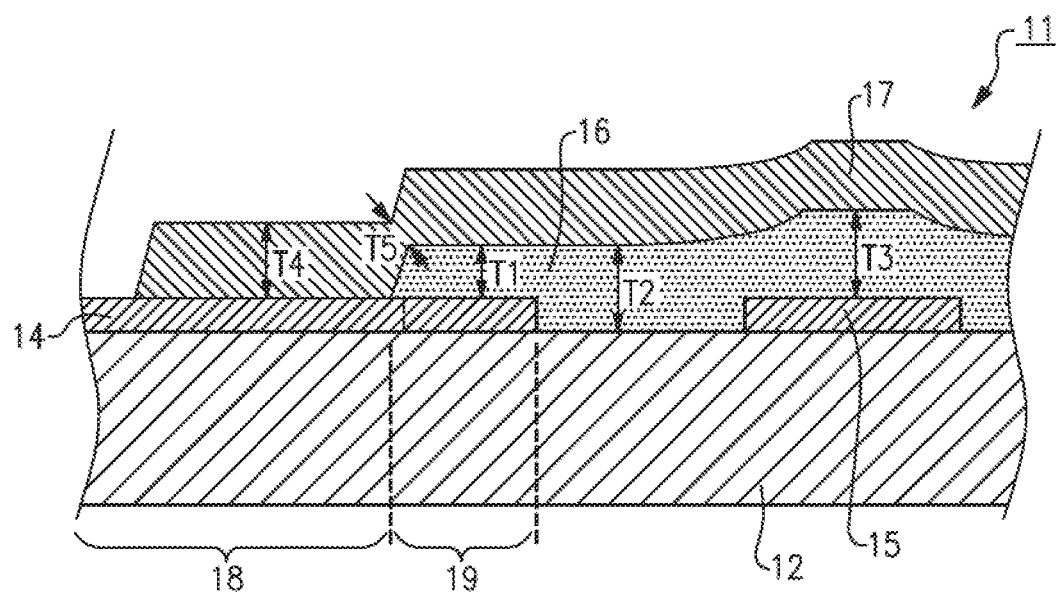
FIG. 1B is a cross-sectional view of the elastic wave device of FIG. 1A taken along line B-B in FIG. 1A.

Referring to FIGS. 1A and 1B there is illustrated one embodiment of an elastic wave device according to aspects of the present invention. FIG. 1A shows a top view of an elastic wave device 11 according to this embodiment, and FIG. 1B shows a cross-sectional view of the elastic wave device 11 taken along line B-B in FIG. 1A. As shown in FIGS. 1A and 1B, the elastic wave device 11 includes a substrate 12, an interdigital transducer (IDT) electrode 13 provided on an upper surface of the substrate 12, and wiring electrodes 14, 15 provided on the upper surface of the substrate 12. The elastic wave device 11 further includes a dielectric film 16 that covers the IDT electrode 13 and the wiring electrode 15, but does not cover a portion of the wiring electrode 14 on the upper surface of the substrate 12. The elastic wave device 11 also includes another wiring electrode 17 that extends from an upper surface of the wiring electrode 14 toward and over an upper surface of the dielectric film 16, and is crossed with the wiring electrode 15 at a different grade. It is to be appreciated that the IDT electrode 13 and the wiring electrode 14 may be configured as integral or separate, provided that they are electrically connected. If configured as separate, the IDT electrode 13 and the wiring electrode 14 may be made of different electrode materials. The substrate 12 may be a piezoelectric substrate, for example, a substrate consisting of piezoelectric single crystal such as lithium tantalate, lithium niobate, quartz crystal, and the like.

The IDT electrode 13 includes comb-shaped electrodes disposed opposite to each other, each of which is configured as a resonator that excites a specific elastic wave on the upper surface of the substrate 12 when an electric signal is input. The IDT electrode 13 may be formed from, for example, a single metal element, such as aluminum, copper, silver, gold, titanium, tungsten, molybdenum, platinum or chromium, an alloy composed mainly thereof, or a layered structure thereof. A thickness of the IDT electrode 13 may range from 0.2 µm to 0.6 µm, for example.

The wiring electrodes 14, 15, 17 are wirings leading from the IDT electrode 13 and may be made of an electrically conductive material, such as aluminum or copper, for example, to form a circuit of the elastic wave device 11. The wiring electrode 14 has a first region 18 that is not covered with the dielectric film 16 and also has a second region 19 that is covered with the dielectric film 16. The wiring electrode 17 has one end formed on the upper surface of the wiring electrode 14 in the first region 18. As shown in FIG. 1A, the first region 18 is configured as an aperture that may be formed by etching and removing a portion of the dielectric film 16 overlaying the wiring electrode 14. The second region 19 is formed around the first region 18 and is covered with the dielectric film 16. The wiring electrode 15 is overlaid with the dielectric film 16 and is further crossed with the wiring electrode 17 at an upper grade above the dielectric film 16. The wiring electrode 17 is a conductor provided from an upper surface of the wiring electrode 14 in the first region 18 to an upper surface of the dielectric film 16 via a side surface of the dielectric film 16 and is crossed with the wiring electrode 15 positioned at a lower grade. A thickness of each of the wiring electrodes 14, 15 may range from 0.2 µm to 0.6 µm, for example. A thickness of the wiring electrode 17 may range from 1 µm to 3 µm, for example.

The dielectric film 16 may have a certain film thickness and shape so as to cover the IDT electrode 13 to ensure the operating characteristics of the elastic wave device 11 and to protect the IDT electrode 13 from chemical degradation and mechanical damage, for example. The dielectric film 16 may further ensure insulation between the wiring electrode 15 and the wiring electrode 17 that are crossed with each other at different grades (different heights above the surface of the substrate 12). The dielectric film 16 may be formed as an inorganic insulating film of oxide, such as a medium the main component of which is silicon dioxide ($SiO_2$), for example. In certain examples, the silicon dioxide has a frequency temperature coefficient of which the sign is opposite to the frequency temperature coefficient of the substrate 12. Accordingly, using silicon dioxide for the dielectric film 16 may improve the frequency temperature characteristic of the elastic wave device 11. In one example, at regions on the substrate 12 at or near which the wiring electrodes 14, 15 are not present, a thickness of the dielectric film 16 ranges from 1 µm to 3 µm. At the center portion of the dielectric film 16 that covers the wiring electrodes 14, 15 occupying a greater area, a thickness of the dielectric film 16 may range from 1 µm to 3 µm, for example.

During deposition of the dielectric film 16 on the substrate 12, the dielectric film 16 may form rounded, concave or convex surface shapes where it is deposited over the IDT electrode 13 due to the presence of the fingers of the IDT electrode 13. Where this concave/convex shape becomes significant on the upper surface of the dielectric film 16, the characteristics of the elastic wave device 11 may be degraded. Therefore, the upper surface of the dielectric film 16 may be smoothed by performing a sputtering film deposition upon the deposition of the dielectric film 16 with a bias voltage applied to the substrate 12. Alternatively, the upper surface of the dielectric film 16 may be smoothed by polishing the upper surface after the deposition of the dielectric film 16 has been completed. As a result, the upper surface of the dielectric film 16 may be smoothed to a sufficient level such that the dielectric film 16 may form a mild ramp from a portion where the wiring electrodes 14, 15 do not exist toward a portion where the wiring electrodes 14, 15 exist. Thereafter, the dielectric film 16 may be etched to form or expose the first region 18 at a portion on the upper surface of the wiring electrode 14 for a connection to the wiring electrode 17.

The elastic wave device 11 includes cutouts 20, each of which extends in the thickness direction (Tn) through the second region 19 adjacent to the first region 18 in the first wiring electrode 14, as shown in FIG. 1A. It is to be appreciated that the cutouts 20 may not only extend through the second region 19 but also reach the first region 18. In the embodiment of FIGS. 1A and 1B, the shapes of the cutouts 20 are a pattern of comb teeth provided from the edge of the wiring electrode 14 in the second region 19 toward the first region 18. In one example, in the pattern of comb teeth formed by the cutouts 20, the width of the comb fingers (or teeth) may range from 0.2 to 3 µm, the pitch between adjacent comb fingers may range from 0.2 to 3 µm, and the length of the comb fingers may range from 0.2 to 10 µm.

Providing the cutouts 20 may allow a thickness T1 of the dielectric film 16 that covers the first wiring electrode 14 in a region including the cutouts 20 to be less than a thickness T2 of the dielectric film 16 in a region where the wiring electrodes 14, 15 are not present below the dielectric film 16, and also to be less than a thickness T3 of the dielectric film 16 in a region above the wiring electrode 15. Further, a thickness T1 of the dielectric film 16 that covers the first wiring electrode 14 in a region including the cutouts 20 may be less than a thickness T4 of the second wiring electrode 17 above the first wiring electrode 14. Accordingly, by reducing the thickness T1, one can ensure that the second wiring electrode 17 has a certain thickness, as well as a certain mechanical strength, at the edge of the dielectric film 16, to reduce the risk of an increased conduction resistance and disconnection so that the connection reliability of the elastic wave device 11 can be improved in the wirings crossed with each other at a different grade. Still further, a thickness T5 of the thinnest of portions of the second wiring electrode 17 extending from an edge of the dielectric film 16 to an upper surface of the second wiring electrode 17 around a location where the first region and the second region are proximate to each other, although less than a thickness T4 of the second wiring electrode 17 in the first region, may be sufficient (as a result of reduced thickness T1) to avoid excessive thinning and high risk of breakage or failure in this region. As shown in FIG. 1B, the thickness T1 of the dielectric film 16 covering the first wiring electrode 14 in a region including the cutouts 20 is a thickness from the upper surface of the first wiring electrode 14 to the upper surface of the dielectric film 16 in a region including the cutouts 20.

Figure 2A:
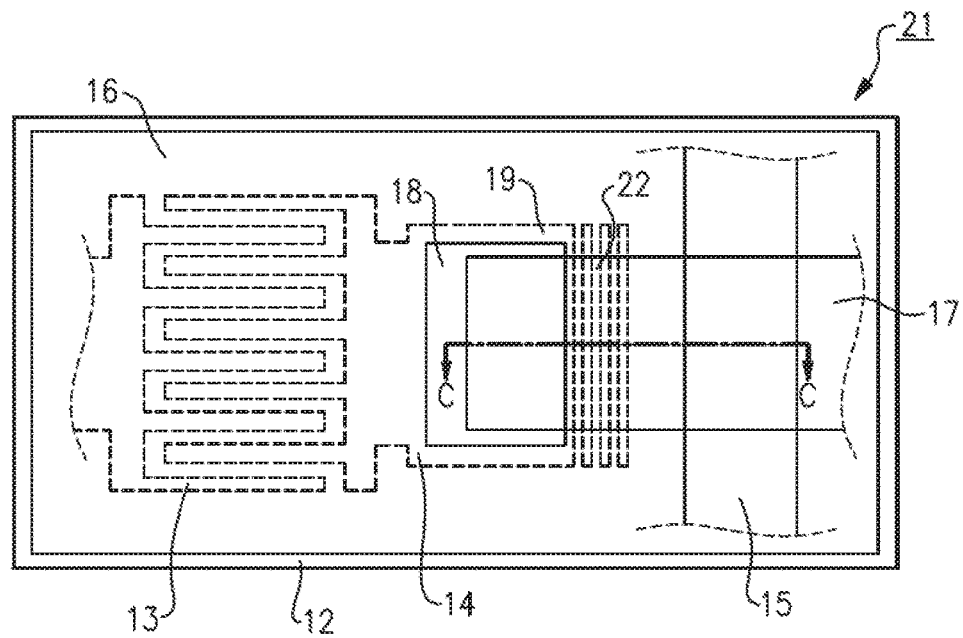
FIG. 2A is a top view of another embodiment of an elastic wave device according to aspects of the present invention.
Figure 2B:
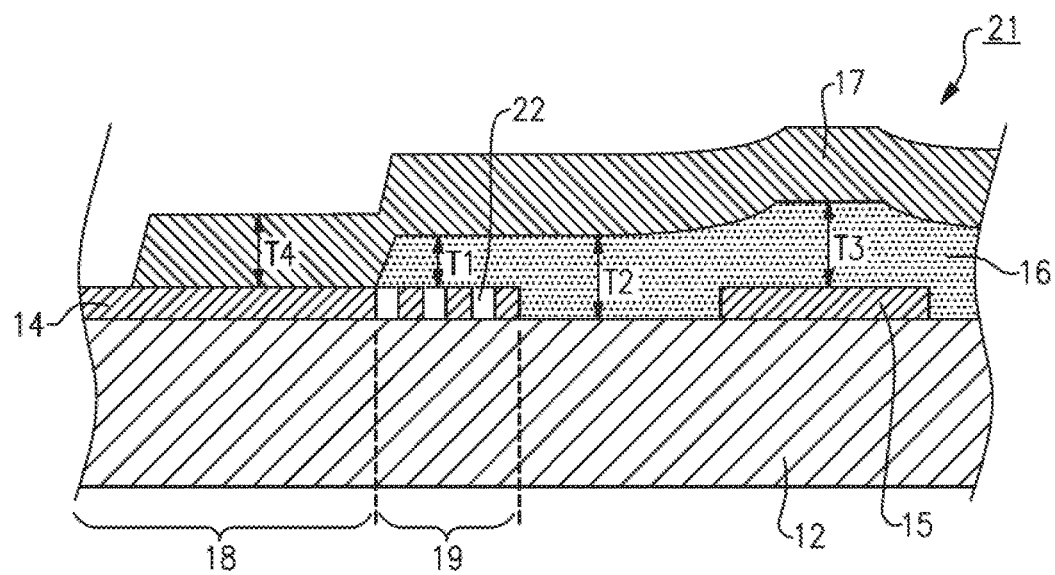
FIG. 2B is a cross-sectional view of the elastic wave device of FIG. 2A taken along line C-C in FIG. 2A.

Referring to FIGS. 2A and 2B, there is illustrated another embodiment of an elastic wave device according to aspects of the present invention. FIG. 2A shows a top view of an elastic wave device 21 according to this embodiment. FIG. 2B shows a cross-sectional view taken along line C-C in FIG. 2A. Components of elastic wave device 21 that are in common with those of elastic wave device 11 of the embodiment shown in FIGS. 1A and 1B are designated by like reference numerals and are not further described. The elastic wave device 21 as shown in FIGS. 2A and 2B differs from the elastic wave device 11 as shown in FIGS. 1A and 1B in that the cutouts 22 extending through the first wiring electrode 14 in the thickness direction may form slits extending in a direction along the surface of the substrate 12, as shown in FIG. 2A, for example. It is to be appreciated that a slit as described herein designates a shape continuing from one end to the other end of the first wiring electrode 14 and is not limited to a specific shape, such as a rectangle, for example. Several examples may include a slit extending in a direction perpendicular to the direction in which the electrode fingers extend, as shown in FIG. 2A, and a slit extending obliquely relative to the direction in which the electrode fingers extend (not shown). In addition, a slit formed in zigzag with respect to a direction along the surface of the substrate 12 (not shown) is another example. The elastic wave device 21 includes cutouts 22 that extend through the first wiring electrode 14 in the thickness direction in the second region 19 adjacent to the first region 18. The cutouts 22 forming slits extending in a direction along the surface may exist not only in the second region 19 but may also extend into the first region 18.

Due to the presence of the cutouts 22, a thickness T1 of the dielectric film 16 covering the first wiring electrode 14 in a region including the cutouts 22 may be made less than a thickness T2 of the dielectric film 16 in a region where the wiring electrodes 14, 15 are not present below the dielectric film 16. The thickness T1 may also be made less than a thickness T3 of the dielectric film 16 above the wiring electrode 15. Further, a thickness T1 of the dielectric film 16 that covers the first wiring electrode 14 in a region including the cutouts 22 may be less than a thickness T4 of the second wiring electrode 17 above the first wiring electrode 14. Accordingly, as discussed above, one can ensure that the second wiring electrode 17 has a certain thickness, as well as a certain mechanical strength, at the edge of the dielectric film 16, to reduce the risk of an increased conduction resistance and disconnection so that the connection reliability of the elastic wave device 21 can be improved in the wirings crossed with each other at a different grade. As shown in FIG. 2B, the thickness T1 of the dielectric film 16 covering the first wiring electrode 14 in a region including the cutouts 22 is a thickness from the upper surface of the first wiring electrode 14 to the upper surface of the dielectric film 16 in a region including the cutouts 22.

Figure 3A:
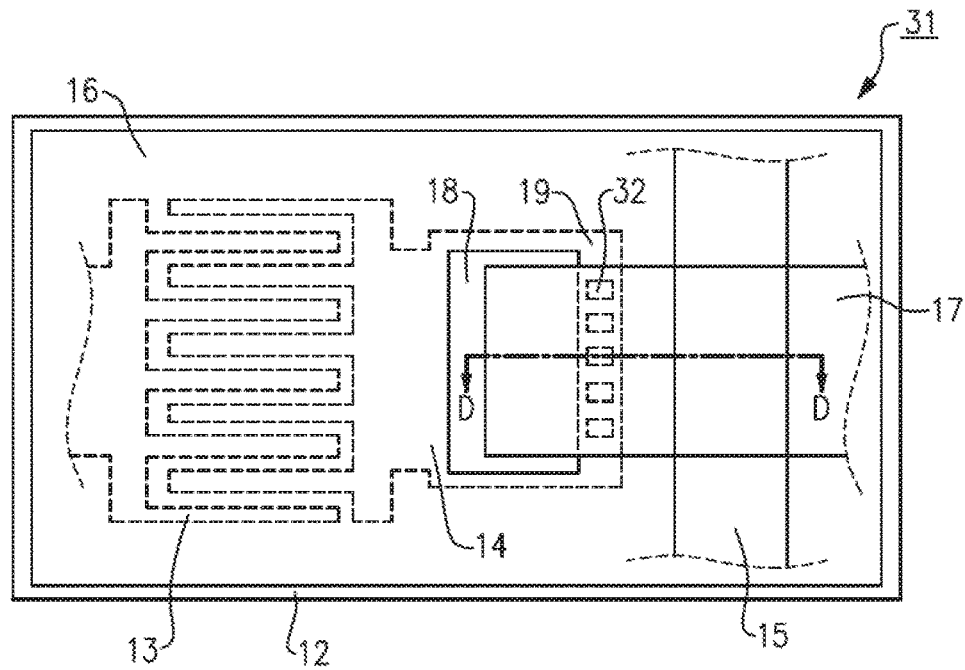
FIG. 3A is a top view of another embodiment of an elastic wave device according to aspects of the present invention.
Figure 3B:
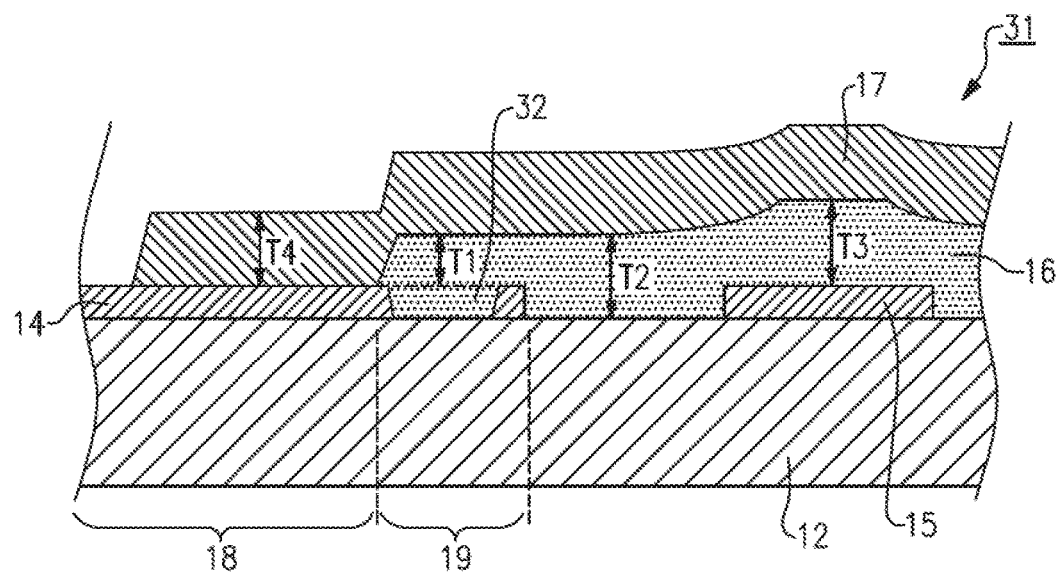
FIG. 3B is a cross-sectional view of the elastic wave device of FIG. 3A taken along line D-D in FIG. 3A.

Referring to FIGS. 3A and 3B, there is illustrated another embodiment of an elastic wave device according to aspects of the present invention. FIG. 3A illustrates a top view of an elastic wave device 31 according to this embodiment, and FIG. 3B illustrates a cross-sectional view taken along line D-D in FIG. 3A. Components of elastic wave device 31 that are in common with those of elastic wave devices 11 and/or 21 are designated by like reference numerals and are not further described. The elastic wave device 31 as shown in FIGS. 3A and 3B differs from the elastic wave device 11 as shown in FIGS. 1A and 1B in that the cutouts 32 are configured as through-holes provided across the first wiring electrode 14 in the thickness direction. The through-holes are not limited to any specific shape or size. For example, the cutouts 32 may be configured as a plurality of through-holes arranged in a direction perpendicular to the direction in which the electrode fingers extend (as shown in FIG. 3A), or as a single through-hole (not shown) disposed across the entire second region 19. Further, the cross-sectional shapes of the through-holes taken in a direction along the surface of the substrate 12 also are not limited. For example, the shapes may be rectangular, circular, oblong, and the like.

In one example, the elastic wave device 31 includes the cutouts 32 that are configured as through-holes provided across the first wiring electrode 14 in the thickness direction in the second region 19 adjacent to the first region 18. The cutouts 32 as through-holes may be provided not only in the second region 19 but may also extend into the first region 18. Due to the presence of the cutouts, a thickness T1 of the dielectric film 16 covering the first wiring electrode 14 in a region including the cutouts 32 may be reduced and made less than a thickness T2 of the dielectric film 16 in a region where the wiring electrodes 14, 15 are not present below the dielectric film 16, and also made less than a thickness T3 of the dielectric film 16 above the wiring electrode 15 that does not include the cutouts 32. Further, the thickness T1 of the dielectric film 16 that covers the first wiring electrode 14 in the region including the cutouts 32 may be less than a thickness T4 of the second wiring electrode 17 above the first wiring electrode 14. Accordingly, as discussed above, one can ensure that the second wiring electrode 17 has a certain thickness, as well as a certain mechanical strength, at the edge of the dielectric film 16, to reduce the risk of an increased conduction resistance and disconnection so that the connection reliability of the elastic wave device 31 can be improved in the wirings crossed with each other at a different grade. As shown in FIG. 3B, the thickness T1 of the dielectric film 16 covering the first wiring electrode 14 in the region including the cutouts 32 is a thickness from the upper surface of the first wiring electrode 14 to the upper surface of the dielectric film 16 in a region including the cutouts 32.

Figure 4A:
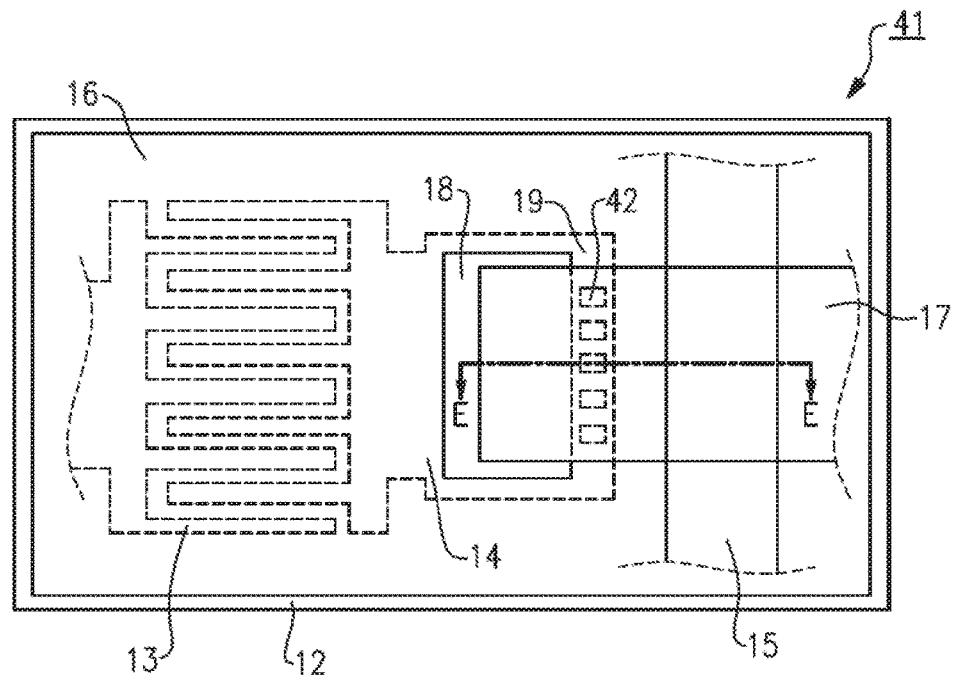
FIG. 4A is a top view of another embodiment of an elastic wave device according to aspects of the present invention.
Figure 4B:
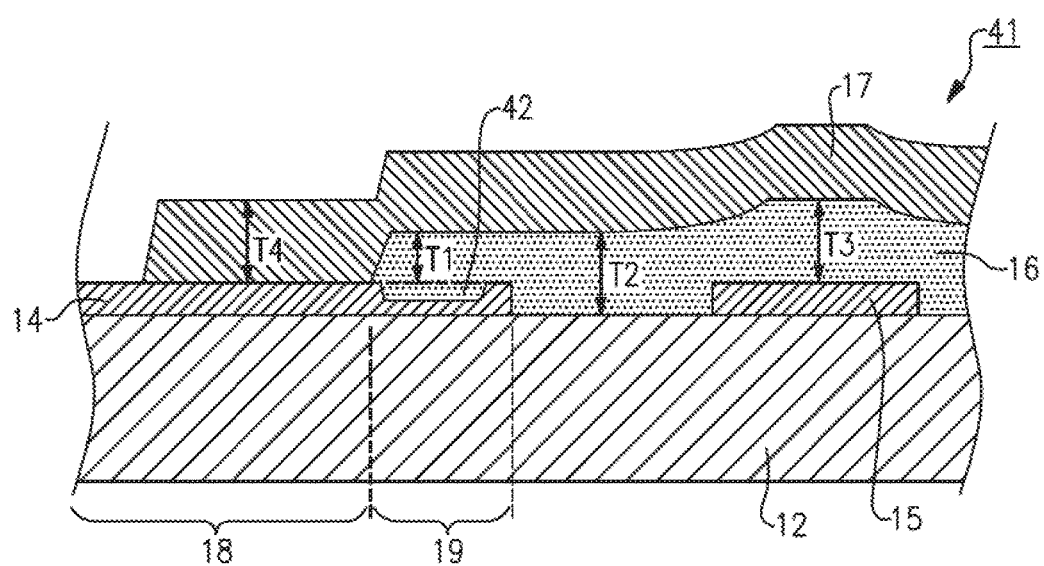
FIG. 4B is a cross-sectional view of the elastic wave device of FIG. 4A taken along line E-E in FIG. 4A.

Referring to FIGS. 4A and 4B, there is illustrated another embodiment of an elastic wave device according to aspects of the present invention. FIG. 4A illustrates a top view of an elastic wave device 41 according to this embodiment, and FIG. 4B shows a cross-sectional view taken along line E-E in FIG. 4A. Components of elastic wave device 41 that are in common with those of elastic wave devices 11, 21, and/or 31 are designated by like reference numerals and are not further described. The elastic wave device 41 as shown in FIGS. 4A and 4B differs from the elastic wave device 11 as shown in FIGS. 1A and 1B in that the cutouts 42 are configured as recesses or detents, provided within the wiring electrode 14 in the thickness direction.

In the illustrated example, the elastic wave device 41 includes the cutouts 42 that are configured as recesses provided within the first wiring electrode 14 in the thickness direction in the second region 19 adjacent to the first region 18. In other examples the cutouts 42 as recesses may be provided not only in the second region 19 but may also extend into the first region 18. As discussed above, due to the presence of the cutouts 42, a thickness T1 of the dielectric film 16 covering the first wiring electrode 14 in a region including the cutouts 42 can be made less than a thickness T2 of the dielectric film 16 in a region where the wiring electrodes 14, 15 are not present below the dielectric film 16. The thickness T1 can also be made less than a thickness T3 of the dielectric film 16 above the wiring electrode 15. Further, the thickness T1 may be less than a thickness T4 of the second wiring electrode 17 above the first wiring electrode 14. Accordingly, as discussed above, one can ensure that the second wiring electrode 17 has a certain thickness, as well as a certain mechanical strength, at the edge of the dielectric film 16, to reduce the risk of an increased conduction resistance and disconnection so that the connection reliability of the elastic wave device 41 can be improved in the wirings crossed with each other at a different grade. It should be noted that, as shown in FIG. 4B, a thickness T1 of the dielectric film 16 covering the first wiring electrode 14 in a region including the cutouts 42 is a thickness from the upper surface of the first wiring electrode 14 to the upper surface of the dielectric film 16 in a region including the cutouts 42.

Embodiments and examples of the above-discussed elastic wave devices may be used in a variety of components, such as, but not limited to, antenna duplexers, modules, and communication devices. It will be appreciated by those skilled in the art, given the benefit of this disclosure, that configuring an antenna duplexer to use embodiments of the elastic wave device according to this disclosure can realize an antenna duplexer having improved characteristics, as well as a module and/or a communication device having enhanced reliability and/or performance using the same.

Figure 5:
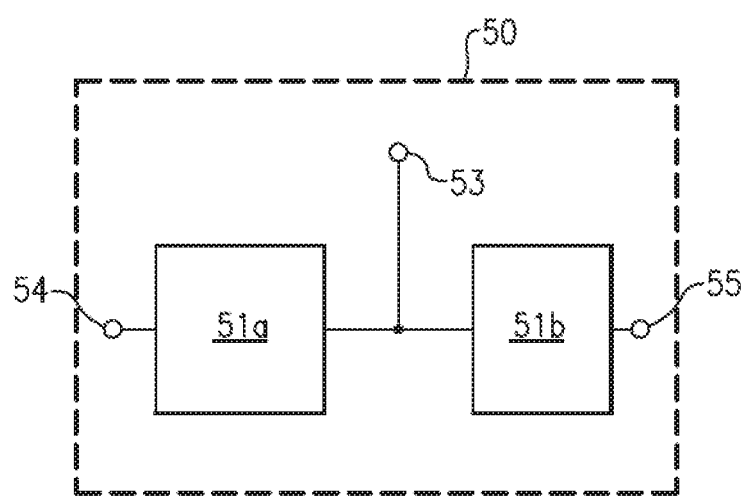
FIG. 5 is a block diagram of one example of an antenna duplexer incorporating an elastic wave device according to aspects of the present invention.

According to one embodiment, the elastic wave device may be used to provide an antenna duplexer having improved characteristics. FIG. 5 illustrates a block diagram of one example of an antenna duplexer 50 which may incorporate embodiments of the elastic wave device 11, 21, 31, and/or 41. The antenna duplexer 50 includes a transmission filter 51a and a reception filter 51b that are connected to a shared antenna terminal 53. The transmission filter 51a includes a transmission-side terminal 54 for connecting the transmission filter to transmitter circuitry, and the reception filter 51b includes a receive-side terminal 55 for connecting the reception filter to receiver circuitry. Configuring the antenna duplexer 50 to include the elastic wave device according to any of the embodiments or examples discussed above as the transmission filter 51a and/or reception filter 51b may improve the connection reliability of a connection electrode used in the antenna duplexer.

Figure 6:
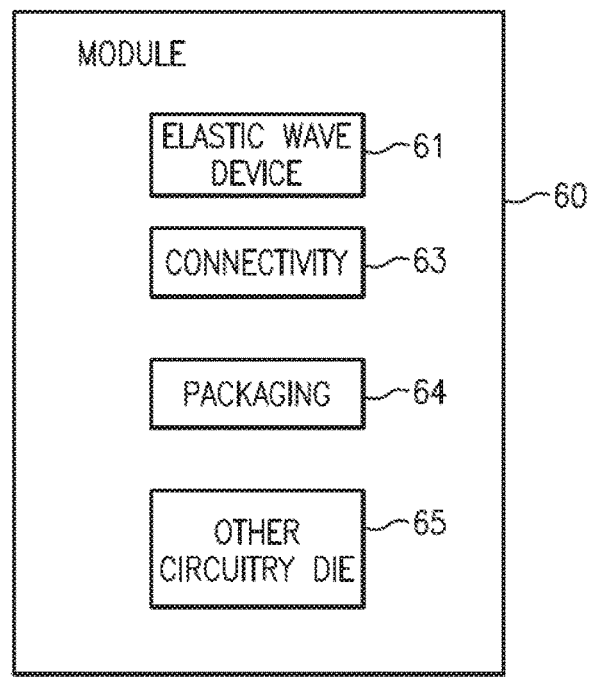
FIG. 6 is a block diagram of one example of a module incorporating an elastic wave device according to aspects of the present invention.

Further, configuring a module (e.g., an elastic wave filter module) using the elastic wave device according to the present embodiments may similarly improve the connection reliability of a connection electrode used in the elastic wave filter or other module. The module may be used in a device, such as a wireless communications device, for example, so as to provide a module having enhanced reliability and/or performance. FIG. 6 is a block diagram illustrating one example of an elastic wave filter module 60 including an elastic wave device 61. The elastic wave device 61 may include any of the elastic wave devices 11, 21, 31, or 41 discussed above. The module 60 further includes connectivity 63 to provide signal interconnections, packaging 64, such as for example, a package substrate, for packaging of the circuitry, and other circuitry die 65, such as, for example amplifiers, pre-filters, modulators, demodulators, down converters, and the like, as would be known to one of skill in the art of semiconductor fabrication in view of the disclosure herein. In certain embodiments, the elastic wave device 61 in module 60 may be replaced with the antenna duplexer 50 (which includes an embodiment of the elastic wave device), so as to provide an RF module, for example.

Figure 7:
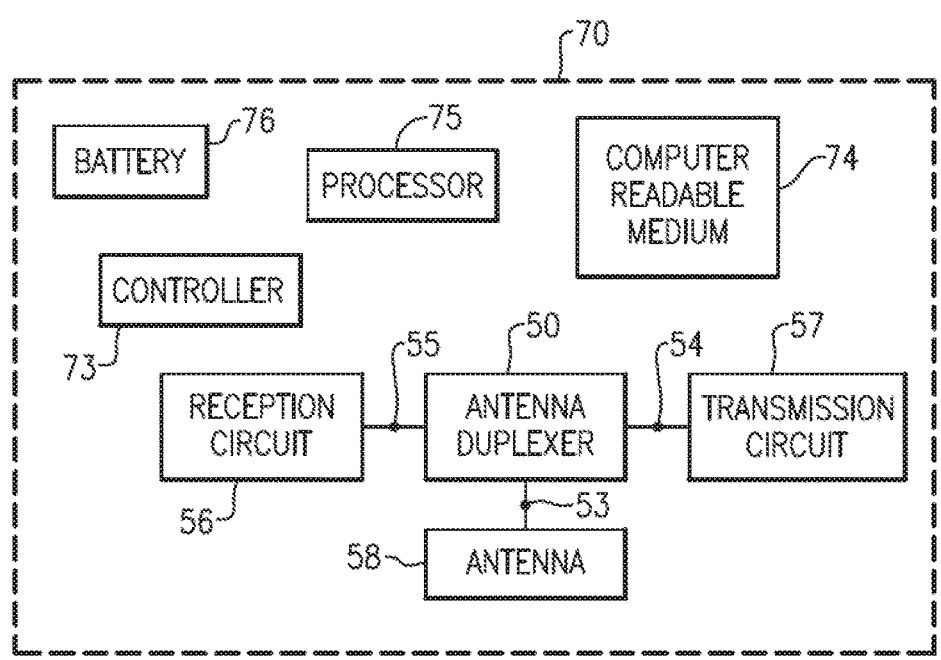
FIG. 7 is a block diagram of one example of a communications device incorporating the antenna duplexer of FIG. 6, according aspects of the present invention.

Still further, configuring a communication device to include the elastic wave device according to the present embodiments may improve the connection reliability of a connection electrode used in the communication device. FIG. 7 is a schematic block diagram of one example of a communication device 70 (e.g., a wireless or mobile device) that can include the antenna duplexer 50 incorporating one or more elastic devices as discussed above. The communication device 70 can represent a multi-band and/or multi-mode device such as a multi-band/multi-mode mobile phone, for example. In certain embodiments, the communication device 70 can include the antenna duplexer 50, a transmission circuit 57 connected to the antenna duplexer via the transmission-side terminal 54, a reception circuit 56 connected to the antenna duplexer 50 via the receive-side terminal 55, and an antenna 58 connected to the antenna duplexer via the antenna terminal 53. The transmission circuit 57 and reception circuit 56 may be part of a transceiver that can generate RF signals for transmission via the antenna 58 and can receive incoming RF signals from the antenna 58. The communication device 70 can further include a controller 73, a computer readable medium 74, a processor 75, and a battery 76.

It will be understood that various functionalities associated with the transmission and receiving of RF signals can be achieved by one or more components that are represented in FIG. 7 as the transmission circuit 57 and the reception circuit 56. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 7 as the antenna 58. For example, a single antenna can be configured to provide both transmitting and receiving functionalities. In another example, transmitting and receiving functionalities can be provided by separate antennas. In yet another example in which the communication device is a multi-band device, different bands associated with the communication device 70 can be provided with different antennas.

To aid switching between receive and transmit paths, the antenna duplexer 50 can be configured to electrically connect the antenna 58 to a selected transmit or receive path. Thus, the antenna duplexer 50 can provide a number of switching functionalities associated with an operation of the communication device 70. In addition, as discussed above, the antenna duplexer 50 includes the transmission filter 51a and reception filter 51b, which are configured to provide filtering of the RF signals. As discussed above, either or both of the transmission filter 51a and reception filter 51b can include embodiments of the elastic wave device 11, 21, 31, or 41, and thereby provide enhanced performance through the benefits of increased connection reliability achieved using embodiments of the elastic wave devices 11, 21, 31, or 41.

As shown in FIG. 7, in certain embodiments, a controller 73 can be provided for controlling various functionalities associated with operations of the antenna duplexer 50 and/or other operating component(s). In certain embodiments, a processor 75 can be configured to ease implementation of various processes for operation of the communication device 70. The processes performed by the processor 75 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 70. In certain embodiments, these computer program instructions may also be stored in the computer-readable medium 74. The battery 76 can be any suitable battery for use in the communication device 70, including, for example, a lithium-ion battery.

Embodiments of the elastic wave device, and the antenna duplexer, the module, and the communication device using the same, may be useful as various electronic devices, such as a cell phone, for example.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An elastic wave device comprising:
   a substrate including a single crystal piezoelectric material;
   an interdigital transducer (IDT) electrode provided on an upper surface of the substrate;
   a first wiring electrode provided on the upper surface of the substrate and connected to the IDT electrode, the first wiring electrode having a first region and a second region and including a cutout in the second region;
   a dielectric film disposed over the upper surface of the substrate, the dielectric film being disposed such that it does not extend over and cover the first wiring electrode in the first region, and being disposed over and covering the first wiring electrode in the second region, a thickness of a first portion of the dielectric film disposed over the first wiring electrode in the second region being less than a thickness of a second portion of the dielectric film covering the upper surface of the substrate in a region of the substrate where the first wiring electrode is not present; and
   a second wiring electrode disposed over and covering an upper surface of the first wiring electrode in the first region, and disposed over and covering an upper surface of the dielectric film in the second region, the thickness of the first portion of the dielectric film being less than a thickness of the second wiring electrode.

2. The elastic wave device of claim 1 wherein a thickness of the IDT electrode is in a range from 0.2 μm to 0.6 μm.

3. The elastic wave device of claim 2 wherein a thickness of the first wiring electrode is in the range from 0.2 μm to 0.6 μm.

4. The elastic wave device of claim 3 wherein the thickness of the second wiring electrode is in a range from 1.0 μm to 3.0 μm.

5. The elastic wave device of claim 1 wherein the cutout includes a pattern of comb teeth that is provided from an edge of the first wiring electrode extending toward the first region.

6. The elastic wave device of claim 1 wherein the cutout is slit shaped.

7. The elastic wave device of claim 1 wherein the cutout includes a through-hole provided across the first wiring electrode and extending from the upper surface of the first wiring electrode to the upper surface of the substrate.

8. The elastic wave device of claim 1 wherein the cutout includes a recess provided within the first wiring electrode.

9. The elastic wave device of claim 1 further comprising a third wiring electrode disposed on the upper surface of the substrate, the dielectric film covering the third wiring electrode, the second wiring electrode being disposed over the upper surface of the dielectric film above the third wiring electrode and electrically insulated from the third wiring electrode by the dielectric film.

10. The elastic wave device of claim 9 wherein the thickness of the first portion of the dielectric film is less than a thickness of a third portion of the dielectric film disposed between the second and third wiring electrodes.

11. The elastic wave device of claim 1 wherein the dielectric film is silicon dioxide.

12. An elastic wave device comprising:
    a substrate including a single crystal piezoelectric material;
    an interdigital transducer (IDT) electrode provided on an upper surface of the substrate;
    a first wiring electrode provided on the upper surface of the substrate and connected to the IDT electrode, the first wiring electrode having a first region and a second region and including a cutout in the second region, the cutout including a pattern of comb teeth that is provided from an edge of the first wiring electrode extending toward the first region;
    a dielectric film disposed over the upper surface of the substrate, the dielectric film being disposed such that it does not extend over and cover the first wiring electrode in the first region, and being disposed over and covering the first wiring electrode in the second region; and
    a second wiring electrode disposed over and covering an upper surface of the first wiring electrode in the first region, and disposed over and covering an upper surface of the dielectric film in the second region.

13. The elastic wave device of claim 12 wherein a thickness of a first portion of the dielectric film disposed over the first wiring electrode in the second region is less than a thickness of the second wiring electrode.

14. The elastic wave device of claim 12 wherein a thickness of a first portion of the dielectric film disposed over the first wiring electrode in the second region is less than a thickness of a second portion of the dielectric film covering the upper surface of the substrate in a region of the substrate where the first wiring electrode is not present.

15. The elastic wave device of claim 12 wherein the dielectric film is silicon dioxide.

16. An elastic wave device comprising:
a substrate including a single crystal piezoelectric material;
an interdigital transducer (IDT) electrode provided on an upper surface of the substrate;
a first wiring electrode provided on the upper surface of the substrate and connected to the IDT electrode, the first wiring electrode having a first region and a second region and including a cutout in the second region, the cutout including at least one through-hole provided in the first wiring electrode and extending from an upper surface of the first wiring electrode to the upper surface of the substrate;
a dielectric film disposed over the upper surface of the substrate, the dielectric film being disposed such that it does not extend over and cover the first wiring electrode in the first region, and being disposed over and covering the first wiring electrode in the second region; and
a second wiring electrode disposed over and covering the upper surface of the first wiring electrode in the first region, and disposed over and covering an upper surface of the dielectric film in the second region.

17. The elastic wave device of claim 16 wherein a thickness of a first portion of the dielectric film disposed over the first wiring electrode in the second region is less than a thickness of the second wiring electrode.

18. The elastic wave device of claim 16 wherein a thickness of a first portion of the dielectric film disposed over the first wiring electrode in the second region is less than a thickness of a second portion of the dielectric film covering the upper surface of the substrate in a region of the substrate where the first wiring electrode is not present.

19. The elastic wave device of claim 16 wherein the at least one through-hole includes a plurality of through-holes arranged across the first wiring electrode in a direction perpendicular to a direction in which electrode fingers of the IDT electrode extend.

20. The elastic wave device of claim 16 wherein a cross-sectional shape of the at least one through-hole taken in a direction along the upper surface of the substrate is one of rectangular and oblong.

* * * * *